United States Patent
Buchanan et al.

(10) Patent No.: US 10,089,574 B2
(45) Date of Patent: Oct. 2, 2018

(54) NEURON CIRCUITS

(71) Applicant: HEWLETT PACKARD ENTERPRISE DEVELOPMENT LP, Houston, TX (US)

(72) Inventors: Brent Buchanan, Palo Alto, CA (US); Sity Lam, Palo Alto, CA (US); Le Zheng, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 2 days.

(21) Appl. No.: 15/264,768

(22) Filed: Sep. 14, 2016

(65) Prior Publication Data
US 2018/0075337 A1 Mar. 15, 2018

(51) Int. Cl.
- G06N 3/04 (2006.01)
- G06N 3/063 (2006.01)
- G06N 3/02 (2006.01)
- G06N 3/08 (2006.01)

(52) U.S. Cl.
CPC ........ G06N 3/04 (2013.01); G06N 3/08 (2013.01); *G06N 3/049* (2013.01); *G06N 3/0454* (2013.01)

(58) Field of Classification Search
CPC .................. G06N 3/04; G06N 3/08
USPC ........................................... 706/28
See application file for complete search history.

(56) References Cited

U.S. PATENT DOCUMENTS

| | | | |
|---|---|---|---|
| 5,138,695 A * | 8/1992 | Means | G06K 9/56 382/156 |
| 5,165,054 A * | 11/1992 | Platt | H03F 3/3001 330/277 |
| 5,274,748 A * | 12/1993 | Boser | G06N 3/063 706/36 |
| 5,422,983 A * | 6/1995 | Castelaz | G06N 3/063 706/42 |
| 6,389,377 B1 * | 5/2002 | Pineda | G10L 15/285 703/2 |
| 9,401,203 B1 * | 7/2016 | Chang | G11C 13/0038 |
| 2003/0094992 A1 * | 5/2003 | Geysen | G05F 3/222 327/403 |
| 2004/0228424 A1 * | 11/2004 | Baldwin | H04W 52/0229 375/343 |
| 2007/0121716 A1 * | 5/2007 | Nagarajan | H03M 1/0682 375/229 |
| 2009/0082691 A1 * | 3/2009 | Denison | A61B 5/04004 600/544 |
| 2010/0241601 A1 * | 9/2010 | Carson | G06N 3/02 706/27 |
| 2011/0181347 A1 * | 7/2011 | Pickett | G11C 13/0002 327/538 |
| 2012/0011091 A1 * | 1/2012 | Aparin | G06N 3/049 706/33 |
| 2012/0011092 A1 | 1/2012 | Tang et al. | |

(Continued)

Primary Examiner — Ly D Pham
(74) Attorney, Agent, or Firm — Trop, Pruner & Hu, P.C.

(57) ABSTRACT

Examples disclosed herein relate to neuron circuits and methods for generating neuron circuit outputs. In some of the disclosed examples, a neuron circuit includes a memristor and first and second current mirrors. The first current mirror may source a first current through the memristor and the second current mirror may sink a second current through the memristor. The memristor may generate a voltage output as a function of the sourced first current and the sunk second current through the memristor.

11 Claims, 5 Drawing Sheets

(56) References Cited

U.S. PATENT DOCUMENTS

| | | | |
|---|---|---|---|
| 2012/0217995 A1* | 8/2012 | Pino | H03K 19/173 |
| | | | 326/38 |
| 2015/0088797 A1 | 3/2015 | Kim et al. | |
| 2015/0347896 A1* | 12/2015 | Roy | G11C 11/16 |
| | | | 365/148 |
| 2016/0342904 A1* | 11/2016 | Merkel | G06N 3/0635 |
| 2017/0103299 A1* | 4/2017 | Aydonat | G06N 3/04 |
| 2017/0110187 A1* | 4/2017 | Whitaker | G11C 13/004 |
| 2017/0323677 A1* | 11/2017 | Ge | G11C 11/24 |

\* cited by examiner

NEURON CIRCUITS

BACKGROUND

Neuron circuits are electrical circuits that, among other things, emulate the behavior of biological neurons. Neuron circuits may be connected in various patterns to form neural networks.

BRIEF DESCRIPTION OF THE DRAWINGS

The following detailed description references the drawings, wherein.

DETAILED DESCRIPTION

Figure 2:
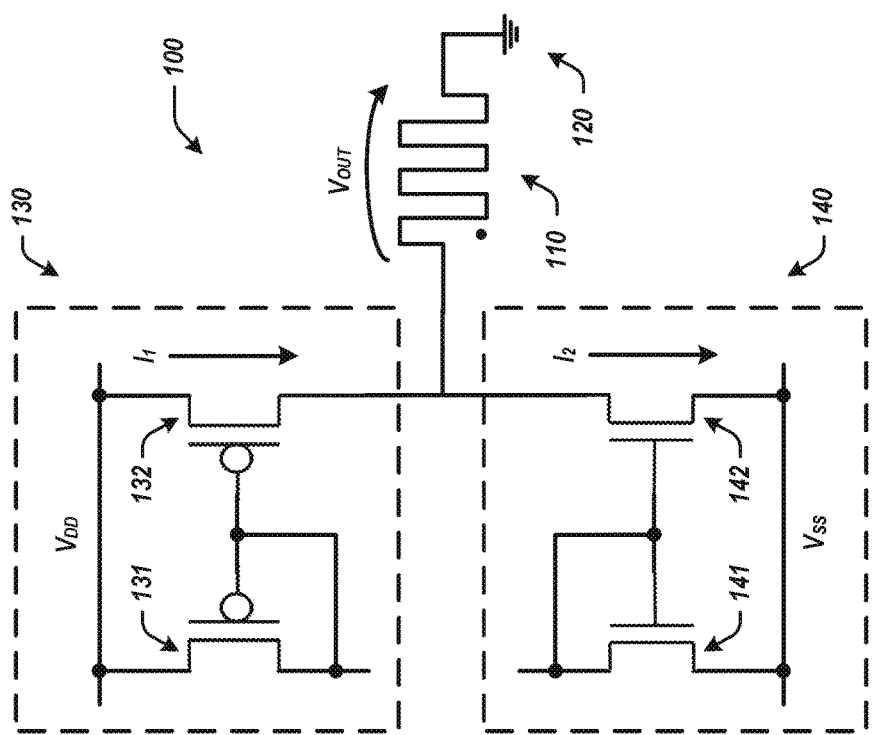
FIG. 2 is a depiction of a graphical representation of a voltage output of the example neuron circuit of FIG. 1.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

Neuron circuits may receive inputs and generate outputs based on the inputs and weights applied to the inputs. For example, a neuron circuit may sum the weighted inputs and apply a neuron function to the sum to generate the output. In some implementations, neuron circuits may generate outputs using digital circuit blocks that use integer and/or floating point computation. Digital circuit blocks, however, may be complex and may use significant space and power consumption to perform neural processing. Moreover, digital circuit blocks may be incapable of generating outputs that represent non-linear neuron functions.

Examples disclosed herein provide technical solutions to these technical challenges by providing neuron circuits and methods for generating neuron circuit outputs. In some of the examples disclosed herein, a neuron circuit may include a memristor that applies neuron functions to weighted inputs by generating a non-linear voltage output for the neuron circuit. The memristor may replace complex digital circuit blocks in neuron circuits, thereby saving significant area and power consumed by neuron circuits. Moreover, the area and power savings become exponential when the disclosed neuron circuits are used to build neural networks.

Figure 1:
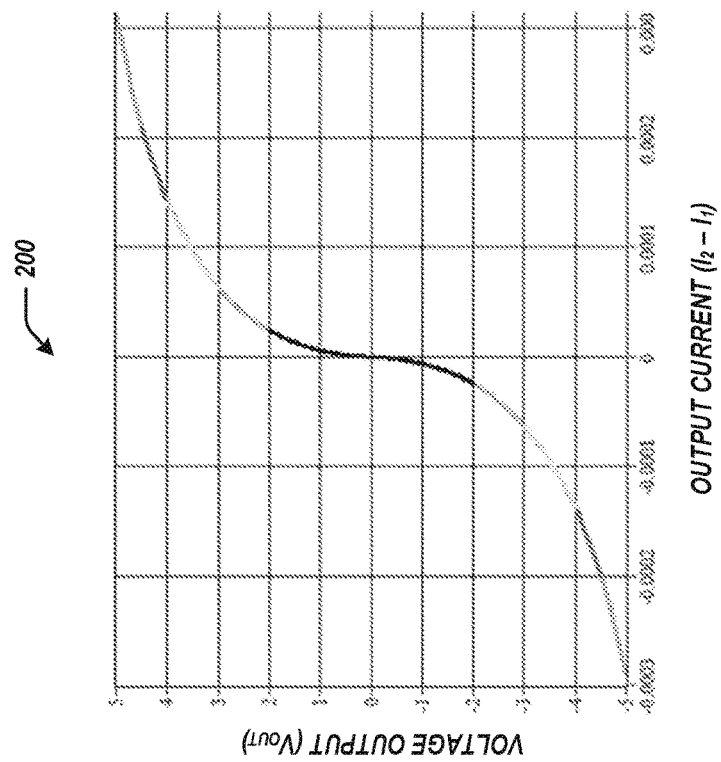
FIG. 1 is a block diagram of an example neuron circuit.

FIG. 1 is a block diagram of an example neuron circuit 100. As shown in FIG. 1, neuron circuit 100 circuit may include a memristor 110 connected to a ground 120 and a plurality of current mirrors (e.g., current mirror 130 and current mirror 140). The number and arrangement of these components is an example only and provided for purposes of illustration. Other arrangements and numbers of components may be utilized without departing from the examples of the present disclosure.

Memristor 110 may be a memristive device having a switching layer sandwiched between two electrodes. The switching layer's level of resistance may be changed by flowing various magnitudes and directions of current through memristor 110. The switching layer of memristor 110 may "remember" or maintain the most recent resistance state even when the current that caused it to enter that state has been removed. The switching layer of memristor 110 may include various switching materials, such as metal oxides (e.g., aluminum oxide, calcium oxide, magnesium oxide, etc.) and/or transition metal oxides (e.g., tantalum oxide, yttrium oxide, hafnium oxide, zirconium oxide, etc.).

In some implementations, the voltage across memristor 110 may be used as an output for neuron circuit 100. For example, various magnitudes and directions of current may flow through memristor 110 and, in response, memristor 110 may generate a voltage output $V_{OUT}$ as a function of the current flowing through memristor 110. As explained above, differing magnitudes and directions of current flowing through memristor 110 may change the level of resistance of the switching layer of memristor 110. As the level of resistance changes, the $V_{OUT}$ across memristor 110 also changes. In some examples, $V_{OUT}$ generated by memristor 110 may have a non-linear relationship with respect to the current flowing through memristor 110. Accordingly, memristor 110 may be used to apply various neuron functions to weighted inputs of neuron circuit 100 for generating non-linear voltage outputs based on the current flowing through memristor 110.

Current mirrors 130 and 140 may source and sink current to and from memristor 110, respectively. Current mirrors 130 and 140 may mirror currents received from other components of neuron circuit 100, such as, for example, other current mirrors, dot product engines, multiple-accumulators, and other circuit components. As illustrated in FIG. 1, current mirror 130 may include a pair of p-channel junction field-effect transistors (PFETs) 131 and 132 while current mirror 140 may include a pair of n-channel junction field-effect transistors (NFETs) 141 and 142. The configurations of current mirrors 130 and 140 illustrated in FIG. 1 are examples only and other current mirror configurations may be used. For example, current mirror 130 and/or 140 may be implemented as gain-boosted current mirrors, wide-swing current mirrors, Widlar current sources, Wilson current mirrors, etc., or combinations thereof.

Current mirror 130 may operate as a current source that sources current from left to right through memristor 110. The gate terminals of PFETs 131 and 132 may be connected to each other, the source terminals of PFETs 131 and 132 may be connected to a voltage source $V_{DD}$, the drain terminal of PFET 131 may be connected to other circuit components of neuron circuit 100, and the drain terminal of PFET 132 may be connected to memristor 110. The source terminal of PFET 131 may also be connected to the gate terminal of PFET 131 such that PFET 131 is diode connected. As a result of the diode connection, PFET 131 and PFET 132 may operate in saturation mode.

PFET 131 may receive a reference current input that flows through the source terminal to the drain terminal of PFET 131. The reference current may be provided, for example, by a resistor (not shown) between the drain terminal of PFET 131 and $V_{SS}$, and may be driven by the circuit components connected to the drain terminal of PFET 131 (i.e., the current draw of the circuit components connected to the drain terminal of PFET 131 may dictate the reference current magnitude flowing through PFET 131). The diode connection (i.e., the gate-drain connection) of PFET 131 may act as a feedback loop such that the reference current may flow through the diode connection to set the gate-source voltage $V_{GS}$ of PFETs 131 to pass the reference current between the source and drain terminals. The feedback loop may set $V_{GS}$ of PFET 132 to be equal to $V_{GS}$ of PFET 131. Due to $V_{GS}$ of PFET 131 and 132 being mirrored, the current output $I_1$ through PFET 132 may be equal to the reference current through PFET 131.

Current mirror 140 may operate as a current sink that sinks current from right to left through memristor 110. The gate terminals of NFETs 141 and 142 may be connected to each other, the source terminals of NFETs 141 and 142 may be connected to a voltage sink $V_{SS}$, the drain terminal of NFET 141 may be connected to other circuit components of neuron circuit 100, and the drain terminal of PFET 142 may be connected to memristor 110. The drain terminal of NFET 141 may also be connected to the gate terminal of PFET 141 such that PFET 141 is diode connected. As a result of the diode connection, PFET 141 and PFET 142 may operate in saturation mode.

PFET 141 may receive a current input that flows through its drain and source terminals. The current input may be provided by, for example, the circuit components connected to the drain terminal of PFET 141. The diode connection (i.e., the gate-drain connection) of PFET 141 may act as a feedback loop such that the reference current may flow through the diode connection to set the gate-source voltage $V_{GS}$ of PFET 141 to pass the reference current between the drain and source terminals. The feedback loop may set $V_{GS}$ Of PFET 142 to be equal to $V_{GS}$ Of PFET 141. Due to $V_{GS}$ Of PFET 141 and 142 being mirrored, the current output $I_2$ being sunk through PFET 142 may be equal to the input current through PFET 141.

As stated above, current mirror 130 may source $I_1$ from left to right through memristor 110 and current mirror 140 may sink current $I_2$ from right to left through memristor 110. Memristor 110 may generate $V_{OUT}$ as a function of $I_1$ and $I_2$. For example, memristor 110 may generate $V_{OUT}$ as a function of the difference between $I_1$ and $I_2$ (e.g., $V_{OUT}=f(I_2-I_1)$). $V_{OUT}$ may be non-linear with respect to the difference between $I_1$ and $I_2$. For example, $V_{OUT}$ may represent a step function output (e.g., y=0 for x<0; and y=1 for x>0), a rectified linear unit output (e.g., y=0 for x<0; and y=x for x>0), or may be substantially similar to a sigmoid output (e.g., a logistic function, $$y = \frac{1}{1+e^{-x}}\Big)$$

as a function of $I_1$ and $I_2$.

While the logistic function is one example sigmoid-like output that may be generated by memristor 110, memristor 110 may generate other sigmoid-like outputs. For example, memristor may generate $V_{OUT}$ to be substantially similar to an error function (e.g., $$y = \text{erf}\left(\frac{\sqrt{\pi}}{2}x\right)\Big),$$

a hyperbolic tangent function (e.g., y=tan h(x)), a Gudermannian function (e.g., $$y = \frac{2}{\pi}gd\left(\frac{\pi}{2}x\right)\Big),$$

an arctangent function (e.g., $$y = \frac{2}{\pi}\arctan\left(\frac{\pi}{2}x\right)\Big),$$

and other algebraic sigmoid functions such as $$y = \frac{x}{\sqrt{1+x^2}}, \text{ and } y = \frac{x}{1+|x|}.$$

Neuron circuit 100 may provide the generated $V_{OUT}$ to other circuit components (e.g., dot product engines, multiply-accumulators, resistor networks, etc.) included in neuron circuit 100 or other neuron circuits as input.

FIG. 2 is a graphical representation 200 of a voltage output $V_{OUT}$ across memristor 110 of example neuron circuit 100 illustrated in FIG. 1. Graphical representation 200 illustrates $V_{OUT}$ as a function of $I_1$ and $I_2$ when the switching layer of memristor 110 includes a tantalum oxide switching material. As shown in FIG. 2, the $V_{OUT}$ across memristor 110 may be substantially similar to a sigmoid function.

Figure 3:
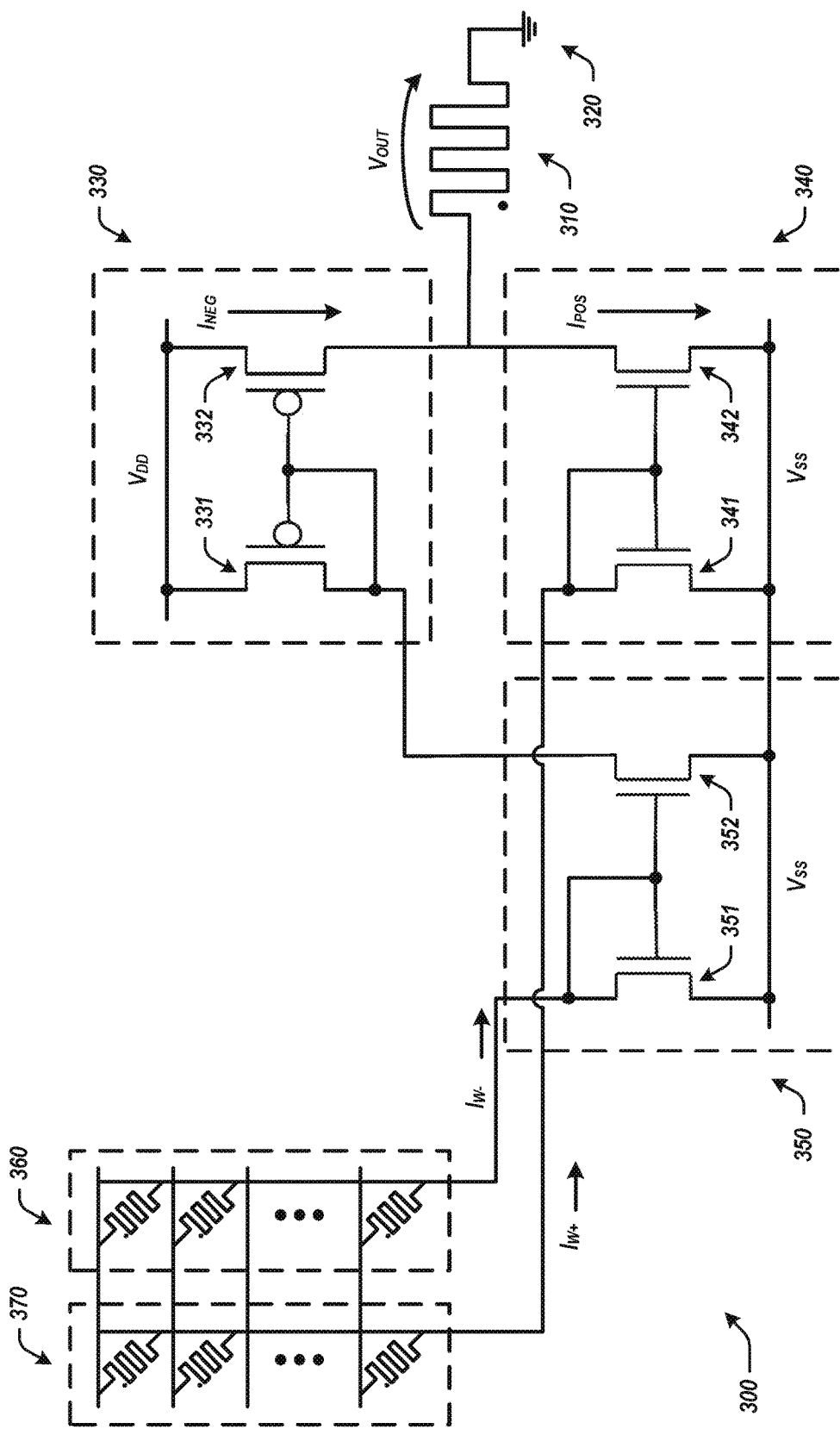
FIG. 3 is a block diagram of an example neuron circuit.

FIG. 3 is a block diagram of an example neuron circuit 300. As shown in FIG. 3, neuron circuit 300 may include a memristor 310 tied to a ground 320 and two current mirrors 330 and 340, a third current mirror 350, and a plurality of circuit blocks 360 and 370. The number and arrangement of these components is an example only and provided for purposes of illustration. Other arrangements and numbers of components may be utilized without departing from the examples of the present disclosure.

Memristor 310, ground 320, and current mirrors 330 and 340 may be similar to memristor 110, ground 120, and current mirrors 130 and 140 of neuron circuit 100 illustrated in FIG. 1. Current mirror 350 may operate as a current sink similarly to current mirror 340. Circuit blocks 360 and 370 may be implemented by various circuit blocks, such as, for example, dot product engines, multiply-accumulators, resistor networks, or any combination thereof. In the example illustrated in FIG. 3, circuit blocks 360 and 370 may each be implemented by multiply-accumulators that each include a plurality of memristors.

In operation, the current through the memristors included in circuit block 360 may be summed and provided to current mirror 350 as an input current $I_{W-}$ to NFET 351. Current mirror 350 may mirror $I_{W-}$ by using the diode connection of NFET 351 to set $V_{GS}$ of NFET 352 so that the magnitude of the current sunk through NFET 352 is equal to the magnitude of $I_{W-}$ through NFET 351. The current being sunk through NFET 352 of current mirror 350 may draw a reference current of equal magnitude through PFET 331 of current mirror 330. Current mirror 330 may mirror an output current $I_{NEG}$ equal to the magnitude of the reference current by using the diode connection of NFET 331 to set $V_{GS}$ of NFET 332, and may source $I_{NEG}$ to memristor 310. $I_{NEG}$ may flow through memristor 310 from left to right.

The current through the memristors included in circuit block 370 may be summed and provided to current mirror 340 as an input current $I_{W+}$ to NFET 341. Current mirror 340 may mirror $I_{W+}$ by using the diode connection of NFET 341 to set $V_{GS}$ of NFET 342 so that the magnitude of the current output $I_{POS}$ sunk through NFET 342 (and thus through memristor 310) is equal to the magnitude of $I_{W+}$ through NFET 341. $I_{POS}$ may flow through memristor 310 from right to left.

The output current $I_{POS}$ generated from the summed currents produced by circuit block 370 may represent "positive" weights of the neuron function calculated by memristor 310 whereas the output current $I_{NEG}$ generated from the summed currents produced by circuit block 370 may represent "negative" weights. Voltage output $V_{OUT}$ generated by memristor 310 may represent the output of the neuron function. $V_{OUT}$ may be a non-linear output generated as a function of $I_{POS}$ and $I_{NEG}$ (e.g., as a function of the difference between $I_{POS}$ and $I_{NEG}$). Neuron circuit 300 may provide the generated $V_{OUT}$ to other circuit components (e.g., dot product engines, multiply-accumulators, resistor networks, etc.) included in neuron circuit 300 or other neuron circuits as input.

In some implementations, circuit block 370 may be a dot product engine or multiply-accumulator that generates weights that include an offset value for the neuron function calculated by memristor 310. Circuit block 360 may include a resistor network that generates a correction value for removing the offset values from the generated weights. $I_{POS}$ may represent the summed weights plus offset values and $I_{NEG}$ may represent the summed correction values. Memristor 310 may calculate the neuron function by generating $V_{OUT}$ as a function of the difference between $I_{POS}$ and $I_{NEG}$.

Figure 4:
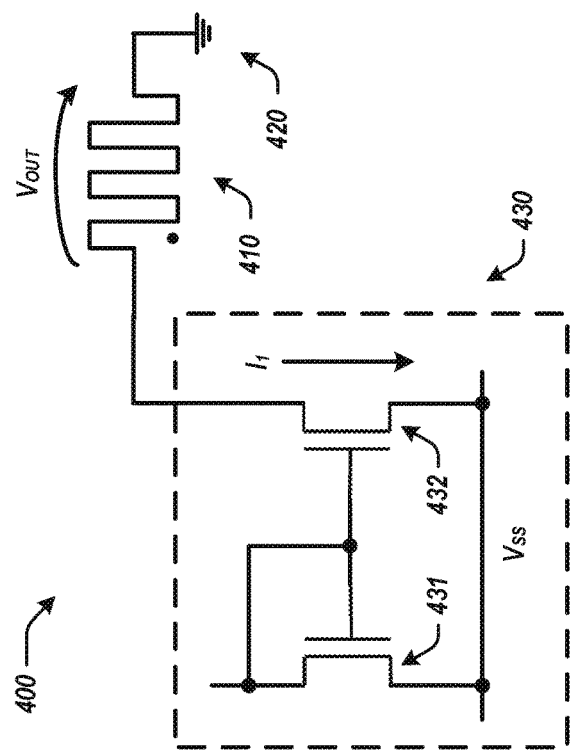
FIG. 4 is a block diagram of an example neuron circuit.

FIG. 4 is a block diagram of an example neuron circuit 400. As shown in FIG. 4, neuron circuit 400 circuit may include a memristor 410 connected to a ground 420 and a current mirror 430. The number and arrangement of these components is an example only and provided for purposes of illustration. Other arrangements and numbers of components may be utilized without departing from the examples of the present disclosure. For example, while memristor 410 is shown connected to ground 420, memristor 410 may instead be connected to $V_{DD}$ in other examples.

In the example neuron circuit 400 illustrated in FIG. 4, current mirror 430 may receive an input current at NFET 431 from other circuit components included in neuron circuit 400. Current mirror 430 may mirror the input current by using the diode connection of NFET 431 to set $V_{GS}$ of NFET 432 so that the magnitude of the current output $I_1$ sunk through NFET 432 (and thus through memristor 410) is equal to the magnitude of the input current through NFET 431. $I_1$ may flow through memristor 410 from right to left and may be used by memristor 410 to generate a voltage output $V_{OUT}$ substantially similar to a half sigmoid (i.e., positive half sigmoid) function. Neuron circuit 400 may provide the generated $V_{OUT}$ to other circuit components (e.g., dot product engines, multiply-accumulators, resistor networks, etc.) included in neuron circuit 400 or other neuron circuits as input.

Figure 5:
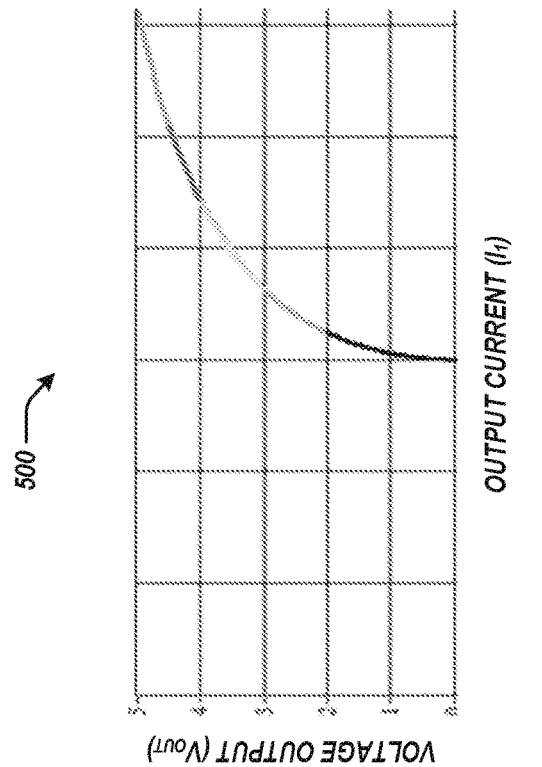
FIG. 5 is a depiction of a graphical representation of a voltage output of the example neuron circuit of FIG. 4.

FIG. 5 is a graphical representation 500 of a voltage output $V_{OUT}$ across memristor 410 of example neuron circuit 400 illustrated in FIG. 4. Graphical representation 500 illustrates $V_{OUT}$ as a function of $I_1$ when the switching layer of memristor 410 includes a tantalum oxide switching material. As shown in FIG. 5, the $V_{OUT}$ across memristor 410 may be substantially similar to a half sigmoid function.

Figure 6:
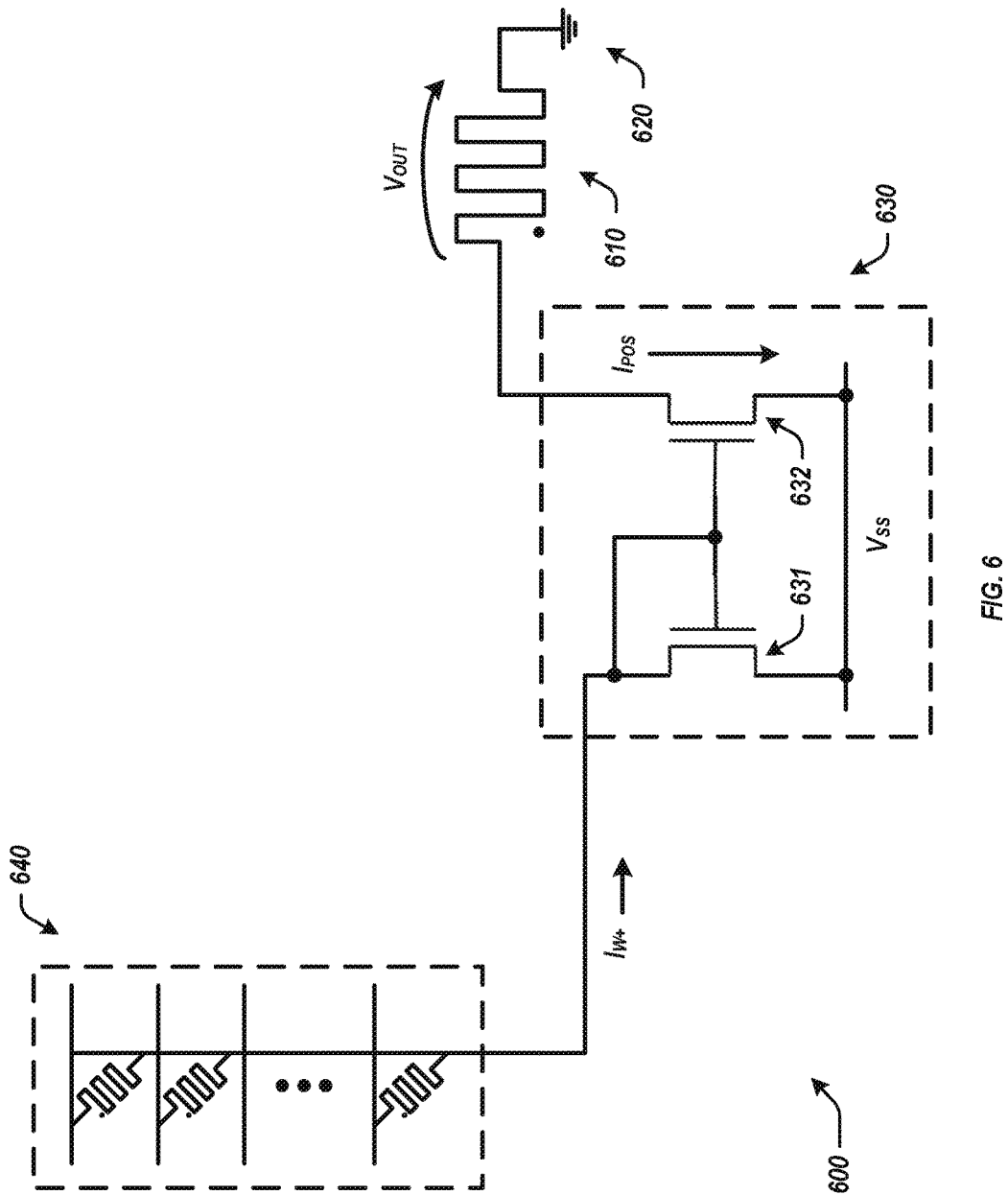
FIG. 6 is a block diagram of an example neuron circuit.

FIG. 6 is a block diagram of an example neuron circuit 600. As shown in FIG. 6, neuron circuit 600 may include a memristor 610 connected to a ground 620 and a current mirror 630, and a circuit block 650 connected to current mirror 630. The number and arrangement of these components is an example only and provided for purposes of illustration. Other arrangements and numbers of components may be utilized without departing from the examples of the present disclosure. For example, while memristor 610 is shown connected to ground 620, memristor 610 may instead be connected to $V_{DD}$ in other examples.

Memristor 610, ground 620, and current mirror 630 may be similar to memristor 410, ground 420, and current mirror 430 of neuron circuit 400 illustrated in FIG. 4. Circuit block 640 may be implemented by various circuit blocks, such as, for example, dot product engines, multiply-accumulators, or resistor networks. In the example illustrated in FIG. 6, circuit block 640 may be implemented by a dot product engine that includes a plurality of memristors.

In operation, the current through the memristors included in circuit block 640 may be summed and provided to current mirror 630 as an input current $I_{W+}$ to NFET 631. Current mirror 630 may mirror $I_{W+}$ by using the diode connection of NFET 631 to set $V_{GS}$ of NFET 632 so that the magnitude of the current output $I_{POS}$ sunk through NFET 632 (and thus through memristor 610) is equal to the magnitude of $I_{W+}$ through NFET 632. $I_{POS}$ may flow through memristor 610 from right to left.

The output current $I_{POS}$ generated from the summed currents produced by circuit block 640 may represent "positive" weights of the neuron function calculated by memristor 610. Voltage output $V_{OUT}$ generated by memristor 610 may represent the output of the neuron function. $V_{OUT}$ may be a non-linear output generated as a function of $I_{POS}$ and may be substantially similar to a half sigmoid function. Neuron circuit 600 may provide the generated $V_{OUT}$ to other circuit components (e.g., dot product engines, multiply-accumulators, resistor networks, etc.) included in neuron circuit 600 or other neuron circuits as input.

Figure 7:
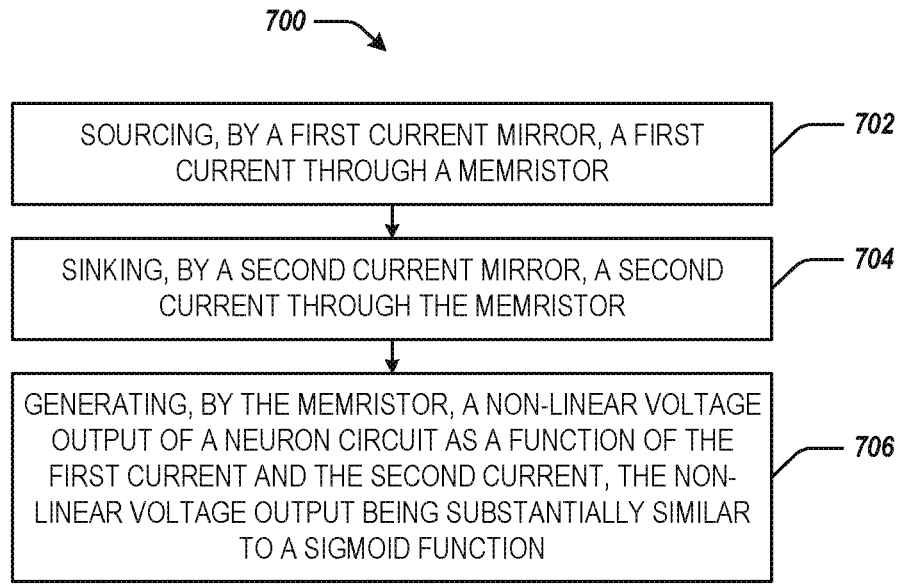
FIG. 7 is a flowchart of an example method for generating an output of a neuron circuit.

FIG. 7 is a flowchart depicting an example method 700 for generating an output of a neuron circuit. Method 700 may, for example, be implemented by example neuron circuit 100 of FIG. 1, example neuron circuit 300 of FIG. 3, or other neuron circuits. In some examples, steps of method 700 may be executed substantially concurrently or in a different order than shown in FIG. 7. In some examples, method 700 may include more or less steps than are shown in FIG. 7. In some examples, some of the steps of method 700 may be ongoing or repeat.

At block 702, method 700 may include sourcing, by a first current mirror, a first current through a memristor. As an example, current mirror 130 of FIG. 1 and current mirror 330 of FIG. 3 may implement block 702.

At block 704, method 700 may include sinking, by a second current mirror, a second current through the memristor. As an example, current mirror 140 of FIG. 1 and current mirror 340 of FIG. 3 may implement block 704.

At block 706, method 700 may include generating, by the memristor, a non-linear voltage output for the neuron circuit as a function of the first current and the second current, the non-linear voltage output being substantially similar to a sigmoid function. As an example, memristor 110 of FIG. 1 and memristor 310 of FIG. 3 may implement block 706. The first current may represent negative weights for the neuron circuit and the second current may represent positive weights for the neuron circuit. In some examples, the memristor may generate the non-linear voltage output of the neuron circuit as a function of the difference between first current and the second current. The neuron circuit may provide the generated voltage output to a dot product engine, multiply-accumulator, or other circuit components of the neuron circuit or other neuron circuits.

Figure 8:
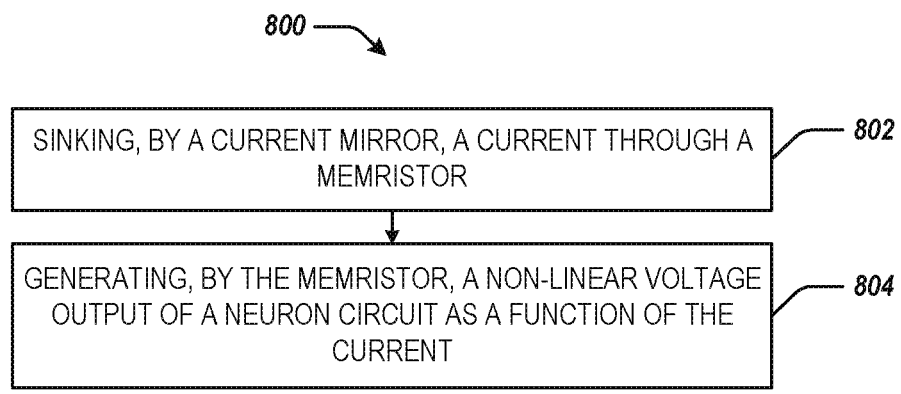
FIG. 8 is a flowchart of an example method for generating an output of a neuron circuit.

FIG. 8 is a flowchart depicting an example method 800 for generating an output of a neuron circuit. Method 800 may, for example, be implemented by example neuron circuit 400 of FIG. 4, example neuron circuit 600 of FIG. 6, or other neuron circuits. In some examples, steps of method 800 may be executed substantially concurrently or in a different order than shown in FIG. 8. In some examples, method 800 may include more or less steps than are shown in FIG. 8. In some examples, some of the steps of method 800 may be ongoing or repeat.

At block 802, method 800 may include sinking, by a current mirror, a current through a memristor. As an example, current mirror 430 of FIG. 4 and current mirror 630 of FIG. 6 may implement block 802.

At block 804, method 800 may include generating, by the memristor, a non-linear voltage output for the neuron circuit as a function of the current. The non-linear voltage output may be substantially similar to a sigmoid function. As an example, memristor 410 of FIG. 4 and memristor 610 of FIG. 6 may implement block 804. The current may represent positive weights for the neuron circuit. The neuron circuit may provide the generated voltage output to a dot product engine, multiply-accumulator, or other circuit components of the neuron circuit or other neuron circuits.

The foregoing disclosure describes a number of example implementations of neuron circuits and methods for generating outputs of neuron circuits. The disclosed examples may include neuron circuits and methods for generating outputs of neuron circuits. For purposes of explanation, certain examples are described with reference to the components illustrated in FIGS. 1-6. The functionality of the illustrated components may overlap, however, and may be present in a fewer or greater number of elements and components. Moreover, the disclosed examples may be implemented in various environments and are not limited to the illustrated examples.

Further, the sequence of operations described in connection with FIGS. 7 and 8 are an examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

The invention claimed is:

1. A neuron circuit, comprising:
   a first current mirror to source a first current through a memristor based on a first input current received by the first current mirror;
   a second current mirror to sink a second current through the memristor based on a second input current received by the second current mirror, wherein the first input current is generated independently from the second input current;
   the memristor to generate a voltage output for the neuron circuit as a function of the sourced first current and the sunk second current through the memristor;
   a first dot product engine to provide the first input current;
   a second dot product engine to generate the second input current; and
   a third current mirror between the first current mirror and the first dot product engine, the third current mirror to generate an intermediate input current from the first input current provided by the first dot product engine;
   wherein the first current mirror is to generate the first current based on the intermediate input current.

2. The neuron circuit of claim 1, wherein the memristor is to generate a voltage output substantially similar to a sigmoid function.

3. The neuron circuit of claim 1, wherein the memristor is to provide the generated voltage output to a dot product engine.

4. The neuron circuit of claim 1, wherein the generated voltage output is a non-linear voltage output.

5. The neuron circuit of claim 1, wherein the memristor includes a tantalum oxide switching material.

6. The neuron circuit of claim 1, wherein:
   the first current mirror comprises two p-channel field effect transistors (PFETs); and
   the second current mirror comprises two n-channel field effect transistors (NFETs).

7. The neuron circuit of claim 1, wherein the memristor is to generate the voltage output for the neuron circuit as a function of the difference between the first current and the second current.

8. A method for generating an output of a neuron circuit, comprising:
   generating, by a first current mirror, a first output current in response to the first current mirror receiving an intermediate current;
   generating, by a second current mirror, a second output current in response to the second current mirror receiving a second input current, wherein the second input current is independent from the first input current;
   generating, by a third current mirror, the intermediate current from a first input current provided by a first dot product engine
   sourcing, by the first current mirror, the first output current through a memristor;
   sinking, by the second current mirror, the second output current through the memristor; and
   generating, by the memristor, a non-linear voltage output of the neuron circuit as a function of the first output current and the second output current, the non-linear voltage output being substantially similar to a sigmoid function.

9. The method of claim 8, wherein the first output current represents negative weights for the neuron circuit and the second output current represents positive weights for the neuron circuit.

10. The method of claim 8, wherein generating the non-linear voltage output for the neuron circuit as a function of the first output current and the second output current comprises generating the non-linear voltage output of the neuron circuit as a function of the difference between the first output current and the second output current.

11. The method of claim 8, comprising:
   providing the generated voltage output to a dot product engine.

* * * * *